United States Patent
Yokozawa et al.

(10) Patent No.: US 9,240,284 B2
(45) Date of Patent: Jan. 19, 2016

(54) CASED CAPACITOR WITHIN SUBSTRATE CIRCUIT

(75) Inventors: Osamu Yokozawa, Nagano (JP); Koji Umemoto, Nagano (JP)

(73) Assignee: RUBYCON CORPORATION (JP)

( * ) Notice: Subject to any disclaimer, the term of this patent is extended or adjusted under 35 U.S.C. 154(b) by 66 days.

(21) Appl. No.: 13/992,556

(22) PCT Filed: Nov. 11, 2011

(86) PCT No.: PCT/JP2011/076097
§ 371 (c)(1),
(2), (4) Date: Jun. 7, 2013

(87) PCT Pub. No.: WO2012/077460
PCT Pub. Date: Jun. 14, 2012

(65) Prior Publication Data
US 2013/0269993 A1    Oct. 17, 2013

(30) Foreign Application Priority Data

Dec. 7, 2010    (JP) .................................. 2010-272863

(51) Int. Cl.
*H01G 9/00*    (2006.01)
*H01G 2/06*    (2006.01)
(Continued)

(52) U.S. Cl.
CPC ................ *H01G 9/0003* (2013.01); *H01G 2/06* (2013.01); *H01G 9/12* (2013.01); *H05K 1/181* (2013.01);
(Continued)

(58) Field of Classification Search
CPC ........... H01G 9/04; H01G 9/12; H01G 9/008; H01G 2/06; H01G 4/228; H01G 4/28; H01G 9/0003; H01G 9/045; H01G 4/00; H01G 4/01; H01G 4/248; H01G 2/00–2/24; H01G 9/00–9/28; H05K 3/3421; H05K 1/181
USPC .................................................... 361/502–541
See application file for complete search history.

(56) References Cited

U.S. PATENT DOCUMENTS 1,973,038 A  *  9/1934  Benedek ........................ 361/310
2,885,607 A  *  5/1959  Roelof ........................... 361/509
(Continued)

FOREIGN PATENT DOCUMENTS

CN    1363723 A    8/2002
CN    1479329 A    3/2004
(Continued)

OTHER PUBLICATIONS

DE 102007020290 (translation of description/specification) (see foreign above).*
(Continued)

*Primary Examiner* — Jeremy C Norris
*Assistant Examiner* — Muhammmed Azam
(74) *Attorney, Agent, or Firm* — Cantor Colburn LLP (57) ABSTRACT

The capacitor includes at least: a capacitor body; two lead wires provided on one end surface; a projecting portion provided at a substantially central portion of another end surface; and at least two relief valves provided on the another end surface. On the another end surface, the at least two relief valves are arranged in substantially rotational symmetry with respect to the projecting portion. Further, an axial center line of the projecting portion and an axial center line of the capacitor substantially correspond to each other. Also provided are a capacitor case to be used the capacitor and a substrate provided with a circuit using the capacitor.

11 Claims, 8 Drawing Sheets

(51) Int. Cl.
*H01G 9/12* (2006.01)
*H05K 1/18* (2006.01)
*H01G 9/08* (2006.01)
*H01G 9/145* (2006.01)
*H01G 4/228* (2006.01)
*H01G 2/12* (2006.01)

(52) U.S. Cl.
CPC .................. *H01G 2/12* (2013.01); *H01G 4/228* (2013.01); *H01G 9/00* (2013.01); *H01G 9/08* (2013.01); *H01G 9/145* (2013.01)

(56) References Cited

U.S. PATENT DOCUMENTS

| | | | | |
|---|---|---|---|---|
| 3,247,570 | A | * 4/1966 | Owczarski et al. | .......... 29/25.42 |
| 3,878,440 | A | * 4/1975 | Ando | ........................... 361/521 |
| 5,521,791 | A | * 5/1996 | Takada | ........................ 361/538 |
| 2004/0052033 | A1 | 3/2004 | Sano et al. | |

FOREIGN PATENT DOCUMENTS

| | | | | |
|---|---|---|---|---|
| DE | 102007020290 | * | 4/2007 | .............. H01G 2/10 |
| EP | 0326335 | * | 1/1989 | .............. H01G 1/14 |
| GB | 550535 | A | | 1/1943 |
| JP | S4974446 | U | | 6/1974 |
| JP | 542140 | U | | 1/1979 |
| JP | 6268225 | U | | 4/1987 |
| JP | 64055818 | A | | 3/1989 |
| JP | 1129819 | U | | 9/1989 |
| JP | 04037110 | A | | 2/1992 |
| JP | 09097741 | A | | 4/1997 |
| JP | H11219869 | A | | 8/1999 |
| JP | 11340105 | A | | 12/1999 |
| JP | 2000082633 | A | | 3/2000 |

OTHER PUBLICATIONS

International Search Report for International application No. PCT/JP2011/076097, Feb. 2, 2012, with English translation.
Chinese Notification of the First Office Action corresponding to Application No. 201180057863.7; Issue Date: Jun. 3, 2015, with English translation.
Extended European Search Report corresponding to Application No. 11846190.4.-1501/2650890 PCT/JP2011/076097; Date of Mailing: Oct. 2, 2015.

* cited by examiner

CASED CAPACITOR WITHIN SUBSTRATE CIRCUIT

CROSS REFERENCE TO RELATED APPLICATIONS

This is the U.S. national stage of application No. PCT/JP2011/076097, filed on 11 Nov. 2011. Priority under 35 U.S.C. §119(a) and 35 U.S.C. §365(b) is claimed from Japanese Application No. 2010-272863, filed 7 Dec. 2010, the disclosure of which is also incorporated herein by reference.

TECHNICAL FIELD

The present invention relates to a capacitor, a capacitor case, and a substrate provided with a circuit.

BACKGROUND ART

An electrolytic capacitor includes a metal case accommodating a capacitor element containing an electrolyte solvent. When the electrolytic capacitor fails due to application of a voltage higher than a rated voltage to the electrolytic capacitor, an internal pressure of the metal case rises due to generation of a gas (hydrogen gas), vaporization of the electrolyte solvent, and the like. A sharp rise in the internal pressure may cause a burst of the electrolytic capacitor. Thus, in order to prevent the burst, the electrolytic capacitor includes a relief valve which opens when the internal pressure exceeds a predetermined threshold (for example, refer to Patent Literature 1). This relief valve is provided to a head surface of a columnar electrolytic capacitor, or one relief valve is provided to a side surface of the electrolytic capacitor.

At the time of assembly of various substrates provided with a circuit including a columnar electrolytic capacitor, the electrolytic capacitor is mounted through soldering to a substrate of the substrate provided with a circuit. At this time, two lead wires extending in an axial direction of an electrolytic capacitor body from one end surface side of the electrolytic capacitor body are soldered while being inserted in through-holes provided through the substrate. However, in this case, the electrolytic capacitor is mounted under a substantially upright state with respect to the substrate, and hence electronic apparatus including the substrate provided with a circuit cannot be reduced in thickness or downsized.

Thus, there have been proposed techniques for preparing a substrate provided with a circuit by mounting the electrolytic capacitor to be laid on a substrate (refer to Patent Literatures 2 to 6). In those techniques, the electrolytic capacitor is mounted to the substrate as follows: providing one auxiliary terminal, which includes a lead wire, has a length sufficiently larger than a diameter of the electrolytic capacitor body, and does not have electrical functions, to an end surface of the electrolytic capacitor body, which is opposite to the side on which the two lead wires are provided; and inserting and soldering the auxiliary terminal into the through-holes of the substrate together with the two lead wires.

CITATION LIST

Patent Literature

[PTL 1] Japanese Utility Model Application Laid-open No. Hei 01-129819 (FIG. 1)
[PTL 2] Japanese Patent Application Laid-open No. Hei 09-97741 (FIGS. 1, 15, etc.)
[PTL 3] Japanese Patent Application Laid-open No. Sho 64-55818 (FIGS. 4, 5, etc.)
[PTL 4] Japanese Patent Application Laid-open No. Hei 04-37110 (FIG. 1, etc.)
[PTL 5] Japanese Utility Model Application Laid-open No. Sho 62-68225 (FIG. 1, etc.)
[PTL 6] Japanese Utility Model Application Laid-open No. Sho 54-2140 (FIG. 3, etc.)

SUMMARY OF INVENTION

Technical Problems

Meanwhile, when the relief valve is provided to the electrolytic capacitors exemplified in Patent Literatures 2 to 6, normally, the relief valve is provided to an outer peripheral surface of the electrolytic capacitor body. This is because, although it is technically possible to provide the relief valve to the end surface to which the auxiliary terminal has already been mounted, a space for forming the relief valve can be significantly more easily secured on the outer peripheral surface in comparison with the end surface. In addition, troubles that cannot be expected in a design stage are more likely to be prevented in a case of providing the relief valve within a large area such as the outer peripheral surface than in a case of additionally providing the relief valve within an inherently small area that has already been provided with the auxiliary terminal, such as the end surface.

However, when the electrolytic capacitor is fixed to the substrate through insertion of the two lead wires and the one auxiliary terminal into the through-holes of the substrate and soldered in a manner that a front surface of the substrate and an axial center line of the electrolytic capacitor are substantially parallel to each other, the following problems occur. Specifically, in this case, when the relief valve is provided to the side surface of the electrolytic capacitor, the gas discharged from an inside of the electrolytic capacitor through opening of the relief valve cannot be regulated to a specific direction. Thus, there are following risks: (1) the gas discharged from the electrolytic capacitor may be blown toward an outside of an electric apparatus incorporating a substrate provided with a circuit, and disturb a user of the electric apparatus; and (2) the discharged gas may be blown to and adversely affect other electric components arranged on the substrate. Those problems may occur also in capacitors of other types than the electrolytic type in which the relief valve for discharging the gas generated in the capacitor due to a failure to the outside needs to be provided.

In order to prevent such problems, for example, there is a method of arranging the relief valve, which is provided to the outer peripheral surface of the capacitor, at a position substantially parallel to a straight line connecting two intersections between the end surface provided with the two lead wires and the two lead wires themselves. In this case, the gas discharged from the capacitor fixed on the substrate can be always directed to a direction substantially parallel to a front surface of the substrate. However, as in the example described above, when the capacitor is prepared under a state in which the relief valve is arranged at a specific position with respect to the two lead wires, at the time of manufacturing the capacitor, the two lead wires need to be mounted with respect to the position of the relief valve provided to the outer peripheral surface of a casing of the capacitor (cylindrical case). Thus, a manufacturing step for the capacitor becomes more complicated, and hence practicality is lowered.

The present invention has been made in view of the circumstances described above. It is an object of the present invention to provide a capacitor which is produced without involving complication of a manufacturing step for the capacitor, and includes a relief valve from which a gas is discharged always in a certain regulated direction in a case where the capacitor is mounted to a substrate in a manner that an axial direction of the capacitor is substantially parallel to a front surface of the substrate, and to provide a capacitor case to be used for the capacitor and a substrate provided with a circuit using the capacitor.

Solution to Problems

The above-mentioned object is achieved by the present invention as follows.

That is, according to the present invention, there is provided a capacitor, including at least: a substantially columnar capacitor body; two electrode terminals provided on one end surface of the substantially columnar capacitor body; a projecting portion provided at a substantially central portion of another end surface of the substantially columnar capacitor body; and at least two relief valves provided on the another end surface, in which, on the another end surface, the at least two relief valves are arranged in substantially rotational symmetry with respect to the projecting portion, and in which an axial center line of the projecting portion and an axial center line of the capacitor substantially correspond to each other.

In a capacitor according to an embodiment of the present invention, it is preferred that the at least two relief valves provided on the another end surface be two relief valves.

In a capacitor according to another embodiment of the present invention, it is preferred that the projecting portion be a columnar member, and that the columnar member include a fixing auxiliary terminal mounted thereto.

In a capacitor according to still another embodiment of the present invention, it is preferred that the projecting portion be a columnar member, and that the columnar member include a linear member mounted to a top surface of the columnar member.

In a capacitor according to a further embodiment of the present invention, it is preferred that the projecting portion be a linear terminal.

In a capacitor according to a further embodiment of the present invention, it is preferred that the substantially columnar capacitor body include at least: a capacitor element; the two electrode terminals connected to the capacitor element; a bottomed cylindrical case for accommodating the capacitor element; and the columnar member provided at a substantially central portion of an outer surface of a bottom portion of the bottomed cylindrical case, and that the bottomed cylindrical case and the columnar member be formed integrally with each other.

In a capacitor according to a further embodiment of the present invention, a ratio of a length of the substantially columnar capacitor body with respect to a diameter of the substantially columnar capacitor body is preferably 1.2 or more.

According to the present invention, there is provided a capacitor case, including at least: a bottomed cylindrical case; a projecting portion provided at a substantially central portion of an outer surface of a bottom portion of the bottomed cylindrical case; and at least two relief valves arranged in substantially rotational symmetry with respect to the projecting portion on the outer surface.

According to the present invention, there is provided a first substrate provided with a circuit, including at least: a substrate including at least three through-holes passing therethrough in a thickness direction of the substrate; and the capacitor of the present invention in which the projecting portion is a columnar member and the columnar member includes a fixing auxiliary terminal mounted thereto, in which the capacitor is fixed to the substrate under a state in which the two electrode terminals and the fixing auxiliary terminal are inserted respectively in any three through-holes selected from the at least three through-holes.

According to the present invention, there is provided a second substrate provided with a circuit, including at least: a substrate including at least three through-holes passing therethrough in a thickness direction of the substrate; and the capacitor of the present invention in which the projecting portion is a columnar member and the columnar member includes a linear member mounted to a top surface of the columnar member, in which the capacitor is fixed to the substrate under a state in which the two electrode terminals and the linear member provided to the top surface of the columnar member are inserted respectively in any three through-holes selected from the at least three through-holes.

According to the present invention, there is provided a third substrate provided with a circuit, including at least: a substrate including at least three through-holes passing therethrough in a thickness direction of the substrate; and the capacitor of the present invention in which the projecting portion is a linear terminal, in which the capacitor is fixed to the substrate under a state in which the two electrode terminals and the linear terminal provided to the another end surface are inserted respectively in any three through-holes selected from the at least three through-holes.

Advantageous Effects of Invention

According to the present invention, it is possible to provide the capacitor which is produced without involving complication of a manufacturing step for the capacitor, and includes the relief valve from which a gas is discharged always in a certain regulated direction in a case where the capacitor is mounted to the substrate in a manner that the axial direction of the capacitor is substantially parallel to the front surface of the substrate, and to provide the capacitor case to be used for the capacitor and the substrate provided with a circuit using the capacitor.

BRIEF DESCRIPTION OF DRAWINGS

FIG. 1 are outline schematic views illustrating an example of a capacitor according to an embodiment of the present invention.

FIG. 3 are outline schematic views illustrating still other examples of the capacitor according to the embodiment of the present invention.

FIG. 4 are outline schematic views illustrating yet another example of the capacitor according to the embodiment of the present invention.

FIG. 8 are schematic views illustrating an example of a capacitor case according to the embodiment of the present invention.

FIG. 9 are schematic views illustrating an example of a substrate provided with a circuit according to a first embodiment of the present invention.

DESCRIPTION OF EMBODIMENTS

Figure 1A:
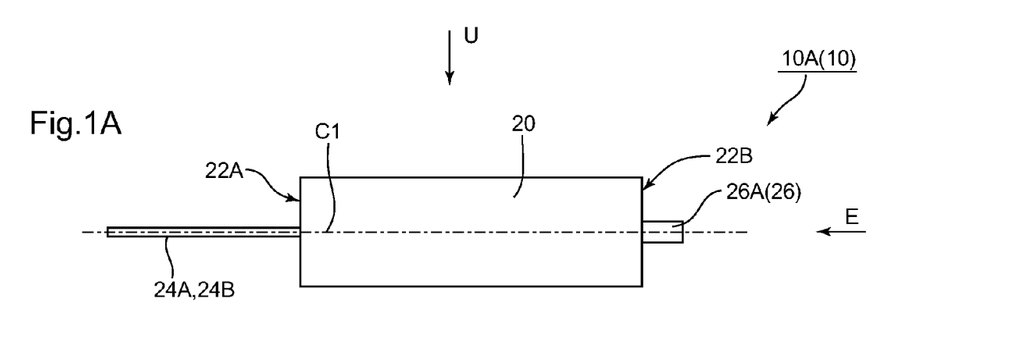
FIG. 1(A) is a side view in which the capacitor is viewed sideways.
Figures 1B, 1C:
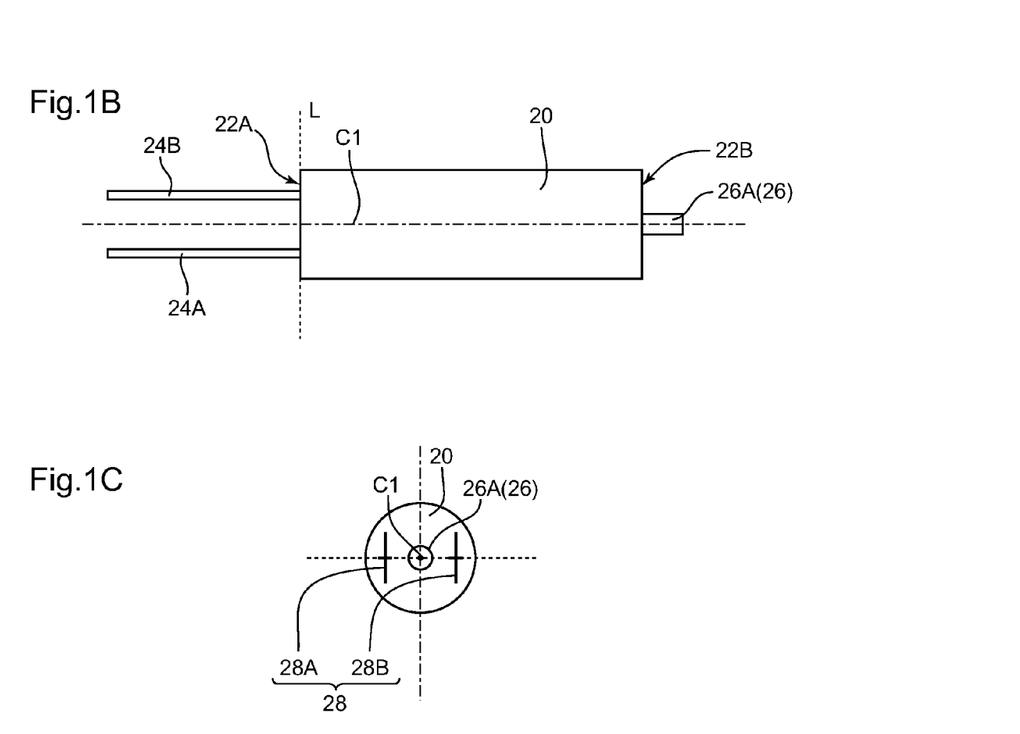
FIG. 1(B) is a top view in which the capacitor is viewed from an upper surface side.
FIG. 1(C) is a front view in which the capacitor is viewed from an end surface side on which a projecting portion is provided.

FIG. 1 are outline schematic views illustrating an example of a capacitor according to an embodiment of the present invention. FIG. 1(A) is a side view in which the capacitor is viewed sideways, FIG. 1(B) is a top view in which the capacitor is viewed from an upper surface side, and FIG. 1(C) is a front view in which the capacitor is viewed from an end surface side on which a projecting portion is provided. Note that, FIG. 1(B) corresponds to a view as viewed in a direction of an arrow U in FIG. 1(A), and FIG. 1(C) corresponds to a view as viewed in a direction of an arrow E in FIG. 1(A).

A capacitor 10A (10) illustrated in FIG. 1 includes at least a substantially circular cylindrical capacitor body 20, two electrode terminals (lead wires 24A and 24B) provided on one end surface 22A of the capacitor body 20, a circular cylindrical columnar member 26A (projecting portion 26) provided at a substantially central portion of another end surface 22B of the capacitor body 20, and two relief valves 28A and 28B (28) provided on the another end surface 22B. Note that, the electrode terminals are not limited to the lead wires exemplified in FIG. 1, and may include any known electrode terminal which is usable as an electrode terminal for a capacitor.

As illustrated in FIG. 1(C), on the another end surface 22B, the relief valve 28A and the relief valve 28B are arranged in substantially rotational symmetry with respect to the columnar member 26A. Further, as illustrated in FIG. 1(A) and FIG. 1(B), an axial center line of the columnar member 26A and an axial center line C1 of the capacitor body 20 substantially correspond to each other. In other words, the axial centerline C1 doubles as an axial center line of the capacitor 10A.

Thus, when the capacitor 10A is mounted to a substrate in a manner that the axial center line C1 of the capacitor 10A is substantially parallel to a front surface of the substrate, a discharge direction of a gas to be discharged from the relief valves 28A and 28B is always regulated only to the end surface 22B side of the capacitor body 20. Further, in this case, as illustrated in FIG. 1(C), as long as the arrangement in substantially rotational symmetry with respect to the columnar member 26A is maintained, the relief valve 28A and the relief valve 28B can be arranged at arbitrary positions on the end surface 22B irrespective of arrangement positions of the two lead wires 24A and 24B positioned on the end surface 22A side. Thus, at the time of manufacturing the capacitor 10A, the two lead wires 24A and 24B can be mounted irrespective of the positions of the relief valves 28A and 28B provided on an end surface of a casing (cylindrical case) of the capacitor 10A, in other words, the end surface 22B. Thus, a manufacturing step for a capacitor is not complicated more than conventional ones.

Figures 2A, 2B:
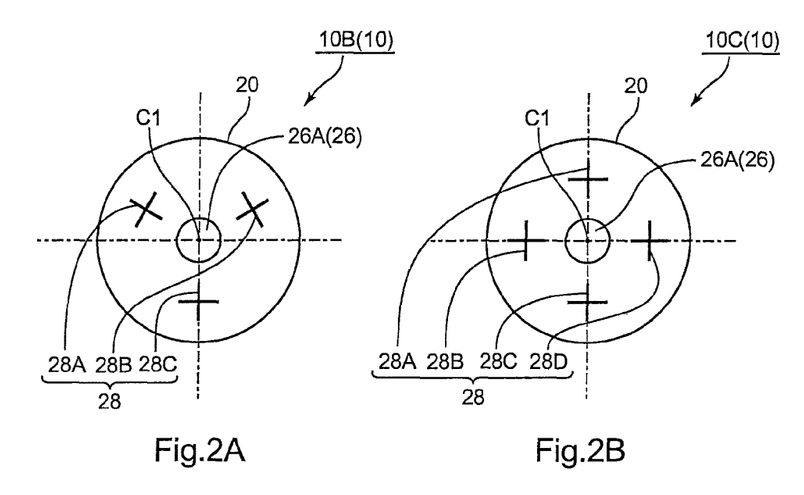
FIG. 2 are front views illustrating other examples of the capacitor according to the embodiment of the present invention.

Note that, the number of the relief valves 28 is not limited to two as exemplified in FIG. 1, and may include arbitrarily selected numbers equal to or more than two. FIG. 2 are front views illustrating other examples of the capacitor according to the embodiment of the present invention, each viewed from the columnar member 26A (projecting portion 26) side. A capacitor 10B (10) illustrated in FIG. 2 (A) includes three relief valves 28A, 28B, and 28C arranged in substantially rotational symmetry with respect to the columnar member 26A (projecting portion 26). A capacitor 10C (10) illustrated in FIG. 2(B) includes four relief valves 28A, 28B, 28C, and 28D arranged in substantially rotational symmetry with respect to the columnar member 26A (projecting portion 26). Note that, structural details of the capacitors 10B and 10C other than the number of the relief valves 28 provided on the end surface 22B are the same as those of the capacitor 10A illustrated in FIG. 1.

In the capacitors 10 according to the embodiment of the present invention as exemplified in FIG. 1 and FIG. 2, the at least two relief valves 28 are provided in substantially rotational symmetry with respect to the projecting portion 26 on the end surface 22B. However, when the gas generated in the capacitor body 20 is discharged to an outside through the at least two relief valves 28, only any one of them is opened. For example, in the example illustrated in FIG. 1(C), of the relief valve 28A and the relief valve 28B, only the relief valve 28A is opened, or only the relief valve 28B is opened. Thus, in view of discharge of the gas, only one relief valve 28 is sufficient.

When the only one relief valve 28 is provided, in view of eccentricity prevention described below, the relief valve 28 is arranged without the symmetry with respect to the projecting portion 26. In addition, the relief valve 28 is formed, for example, through a pressing process on a metal plate part forming the end surface 22B so as to promote pressure concentration on the relief valve 28 and facilitate cleavage thereof when an internal pressure of the capacitor body 20 becomes higher. Thus, at the time of forming the relief valve 28, a central axis of the projecting portion 26 provided on the end surface 22B is inevitably inclined significantly with respect to the axial center line C1 of the capacitor body 20. When such eccentricity occurs, at the time of preparing the substrate provided with a circuit, it is difficult to mount the capacitor 10 to the substrate. Further, when the capacitor 10 to be mounted to the substrate includes eccentric capacitors 10, it is necessary to manually correct eccentricity of each of the capacitors 10 in consideration of difference in eccentric degree of the capacitors 10. As a result, operations become significantly troublesome.

However, the capacitor 10 according to the embodiment of the present invention includes the at least two relief valves 28 in substantially rotational symmetry with respect to the projecting portion 26 arranged at the substantially central portion of the end surface 22B. Thus, at the time of forming the relief valves 28, the central axis of the projecting portion 26 provided on the end surface 22B is not significantly inclined with respect to the axial center line C1 of the capacitor body 20. Therefore, the problem as described above can be prevented.

Note that, when the point described above is taken into consideration, in order to facilitate the formation of the relief valves 28 on the small end surface 22B while reliably preventing the eccentricity, it is optimal to provide two relief valves 28 on the end surface 22B. Further, a shape in a plane direction of each of the relief valves 28 is not particularly limited to the "cross shape" exemplified in FIG. 1 and FIG. 2, and may include shapes such as a linear shape, a V shape, a Y shape, and a K shape as long as the cleavage can be caused to discharge the gas when the internal pressure of the capacitor body 20 becomes higher.

Further, as exemplified in FIG. 1 and FIG. 2, the relief valves 28 need to be arranged in substantially rotational symmetry with respect to the projecting portion 26. However, it is optimal for the relief valves 28 to be arranged in perfect rotational symmetry with respect to the projecting portion 26. Further, the allowable range of the "substantially rotational symmetry" is not particularly limited as long as the eccentricity which may disturb mounting of the capacitor 10 with respect to the substrate provided with a circuit can be effectively prevented.

When an angle of an arrangement position of any one relief valve 28 selected from the plurality of relief valves 28 (for example, relief valve 28A in FIG. 1 and FIG. 2) with respect to the projecting portion 26 is defined as a reference angle (0°), it is preferred that an arrangement angle θ of another relief valve 28 arranged adjacent thereto in a circumferential direction (relief valve 28B in FIG. 1, relief valves 28B and 28C in FIG. 2(A), and relief valves 28B and 28D in FIG. 2(B)) with respect to the projecting portion 26 be set as follows in view of suppressing the eccentricity which may disturb the mounting of the capacitor 10 with respect to the substrate provided with a circuit. Specifically, when the two relief valves 28 are provided (in substantially double symmetry), the arrangement angle θ preferably falls within a range of 180°±30°, more preferably 180°±22.5°. Alternatively, when the three relief valves 28 are provided (in substantially triple symmetry), the arrangement angles θ each preferably fall within a range of 120°±30°, more preferably 120°±22.5°. Still alternatively, when the four relief valves 28 are provided (in substantially quadruple symmetry), the arrangement angles θ each preferably fall within a range of 90°±22.5°, more preferably 90°±15°.

Meanwhile, when the end surface 22B is formed into a circular shape having a radius r (mm), a distance X (mm) from a center point of the projecting portion 26 to a center point of each of the relief valves 28 preferably falls within a range of from r/4 to 3r/4, more preferably from r/3 to 2r/3. Further, in view of suppressing the eccentricity which may disturb the mounting of the capacitor 10 with respect to the substrate provided with a circuit, a maximum allowable variation between the distances X of the respective relief valves 28 is preferably suppressed to r/10 or less.

Note that, in order to calculate the arrangement angle θ and the distance X, the center point of the projecting portion 26 and the center point of the relief valve 28 are used as references. When the relief valve 28 is formed into a linear shape, the center point of the relief valve 28 refers to a bisecting position of a straight line. When the relief valve 28 is formed into a shape other than the linear shape, the center point refers to a center of gravity of a graphic obtained by connecting outermost edges of a shape (line) of the relief valve 28. For example, when the relief valve 28 is formed into the Y shape or the V shape, a center of gravity of a triangular shape corresponds to the center point of the relief valve 28. When the relief valve 28 is formed into the cross shape or the K shape, a center of gravity of a quadrangular shape corresponds to the center point of the relief valve 28.

Further, when the end surface 22B is formed into an elliptical shape having a minor diameter r1 (mm) and a major diameter r2 (mm), it is preferred that an even number of the relief valves 28 be provided; specifically, four or two, optimally two. When the two relief valves 28 are provided, the two relief valves 28 are arranged preferably along a major diameter direction or a minor diameter direction. Further, when the four relief valves 28 are provided, the four relief valves 28 are arranged preferably along the major diameter direction and the minor diameter direction. Alternatively, the four relief valves 28 are arranged preferably along two straight lines which cross each other at a center point of the ellipse and form angles of ±45° with respect to the major diameter direction.

When the projecting portion 26 includes the columnar member 26A as exemplified in FIG. 1 and FIG. 2, the columnar member 26A itself is thick, difficult to bend, and short, and hence does not function as an auxiliary terminal. In this case, the capacitor 10 further includes a fixing auxiliary terminal. In such a case, for example, a fixing auxiliary terminal maybe mounted to the columnar member 26A so that the capacitor 10 can be fixed to the substrate.

Figures 3A, 3B:
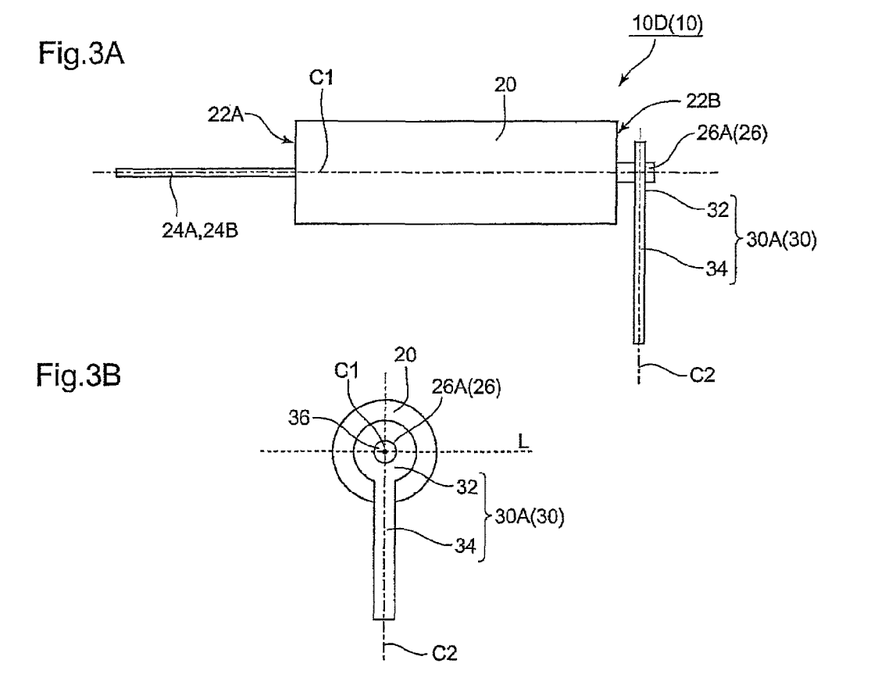
FIG. 3(A) is a side view in which the capacitor body is viewed sideways as in FIG. 1(A)
FIG. 3(B) is a front view in which the capacitor body 20 is viewed from the end surface 22B side as in FIG. 1(C).

FIG. 3 are schematic views illustrating still other examples of the capacitor according to the embodiment of the present invention, specifically, illustrating a state in which a fixing auxiliary terminal 30A (30) is mounted to the columnar member 26A of the capacitor body 20 illustrated in FIG. 1 or FIG. 2. FIG. 3(A) is a side view in which the capacitor body 20 is viewed sideways as in FIG. 1(A), and FIG. 3(B) is a front view in which the capacitor body 20 is viewed from the end surface 22B side as in FIG. 1(C). Note that, FIG. 3(B) does not illustrate the relief valve 28.

The fixing auxiliary terminal 30A (30) mounted to the columnar member 26A of a capacitor 10D (10) illustrated in FIG. 3 includes a concentric circular ring-shaped member 32 (mounting member 30) and a rod-shaped member 34. In a manner that an axial center line C2 of the rod-shaped member 34 (straight line C2 indicated by a dashed line in FIG. 3(A) and FIG. 3(B)) passes a center of an opening portion (hollow portion) 36 which is a circular hole provided at a center of the ring-shaped member 32, the rod-shaped member 34 is connected to an outer rim portion of the ring-shaped member 32. The rod-shaped member 34 is arranged in a manner that the axial center line C2 thereof is substantially orthogonal to a straight line L (straight line L indicated by a dotted line in FIG. 1(B) and FIG. 3(B)) connecting two points at which the two lead wires 24A and 24B and the end surface 22A intersect with each other. With such an arrangement of the rod-shaped member 34, when the two lead wires 24A and 24B are bent to be substantially parallel to the axial center line C2 of the rod-shaped member 34 toward a side on which the rod-shaped member 34 is provided, soldering after insertion of the lead wires 24A and 24B and the rod-shaped member 34 into through-holes of the substrate (not shown) is markedly facilitated. Under a state in which the projecting portion 26 is inserted in the opening portion 36 of the ring-shaped member 32, the ring-shaped member 32 is fixed to the columnar member 26A. Note that, the fixing auxiliary terminal 30A can be mounted to the columnar member 26A, for example, through pressure fixation by crimping the ring-shaped member 32 in two or three directions which are substantially orthogonal to the axial center line C1 of the columnar member 26A, or bonding the ring-shaped member 32 and the columnar member 26A to each other. Note that, in the example illustrated in FIG. 3, the ring-shaped member 32 and the rod-shaped member 34 form an integrally formed single component.

Further, along an inner rim side of the ring-shaped member 32, there may be provided a burring portion extending substantially parallel to an axial direction of the opening portion 36. This burring portion can be formed by a burring process, and may be uniformly divided, for example, into four with respect to a circumferential direction of the opening portion 36.

Figure 4A:
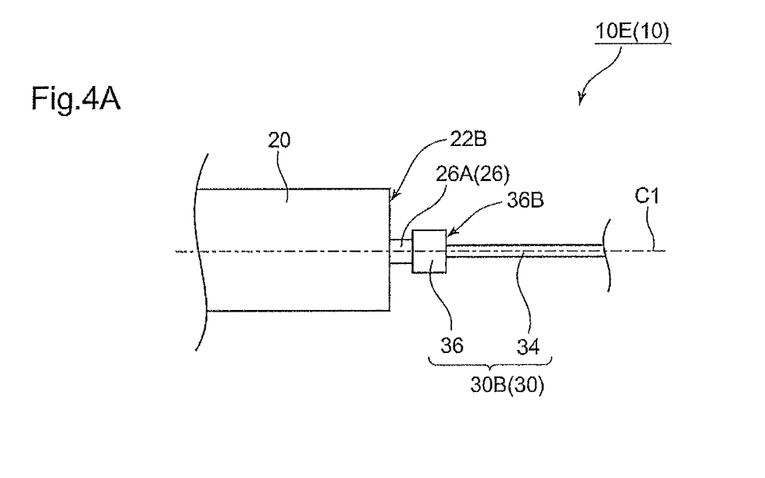
FIG. 4(A) is a side view in which a capacitor body is viewed sideways.
Figure 4B:
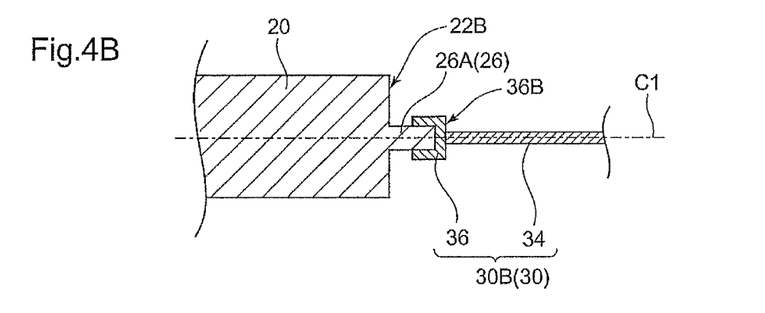
FIG. 4(B) is a sectional view of FIG. 4(A).

FIG. 4 are outline schematic views illustrating yet another example of the capacitor according to the embodiment of the present invention, specifically, illustrating a state in which a fixing auxiliary terminal 30B (30) is mounted to the columnar member 26A of the capacitor body 20 illustrated in FIG. 1 or FIG. 2. FIG. 4(A) is a side view in which the capacitor body 20 is viewed sideways as in FIG. 1(A), and FIG. 4(B) is a sectional view of FIG. 4(A). Note that, FIG. 4(B) does not illustrate details of a sectional structure inside the capacitor body 20.

The fixing auxiliary terminal 30B (30) used for a capacitor 10E (10) illustrated in FIG. 4 includes a bottomed cylindrical member 36 (mounting member 30) and the rod-shaped member 34 connected to an outer surface of a bottom portion 36B of the cylindrical member 36. Note that, the rod-shaped member 34 is connected to the bottom portion 36B of the cylindrical member 36 in a manner that an axial direction thereof substantially corresponds to the axial center line C1 of the capacitor body 20. Further, in the example illustrated in FIG. 4, an axial center line of the cylindrical member 36 and the rod-shaped member 34 corresponds also to the axial center line C1 of the projecting portion 26 and the capacitor body 20. The fixing auxiliary terminal 30B may be mounted to the capacitor body 20 through crimping with application of a force from both sides of the cylindrical member 36, or with use of an adhesive. Note that, when the capacitor 10E is mounted to the substrate provided with a circuit at the time of preparing the substrate provided with a circuit, all of the two lead wires 24A and 24B (not shown in FIG. 4) and the rod-shaped member 34 are bent in the same direction, inserted into the through-holes of the substrate, and then soldered.

Note that, the fixing auxiliary terminals 30 may have various other structures than those exemplified in FIG. 3 and FIG. 4 as long as the mounting portion 30 having a structure capable of being mounted to the columnar member 26A and the rod-shaped member 34 connected to the mounting portion 30 are provided. Further, the fixing auxiliary terminals 30 are applicable also to the capacitors 10B and 10C illustrated in FIG. 2.

In the examples illustrated in FIG. 3 and FIG. 4, the fixing auxiliary terminals 30 are mounted to the columnar member 26A so as to secure a function of the auxiliary terminal. However, the function of the auxiliary terminal may be secured as follows: mounting a linear member 40 to a top surface 26AT of the columnar member 26A as in a capacitor 10F (10) illustrated in FIG. 5; or using, as the projecting portion 26, a linear terminal 26B instead of the columnar member 26A as in a capacitor 10G (10) illustrated in FIG. 6. Note that, the linear member 40 can be mounted to the top surface 26AT through welding or bonding. Further, the linear terminal 26B can be mounted to a vicinity of the central portion of the end surface 22B through welding or bonding. When the capacitor 10F is mounted at the time of preparing the substrate provided with a circuit, all of the two lead wires 24A and 24B (not shown in FIG. 5) and the linear member 40 are bent in the same direction, inserted into the through-holes of the substrate, and then soldered. Similarly, when the capacitor 10G is mounted at the time of preparing the substrate provided with a circuit, all of the two lead wires 24A and 24B (not shown in FIG. 6) and the linear terminal 26B are bent in the same direction, inserted into the through-holes of the substrate, and then soldered.

The columnar member 26A is a columnar member having a thickness and properties which lead to bending difficulty, specifically, refers to a metal columnar member made of aluminum, an aluminum alloy, or the like and having a diameter of 1 mm or more. The columnar member 26A is preferably made of the same material as a material for the capacitor case serving as an outer shell of the electrolytic capacitor body 20. Note that, the diameter of the columnar member 26A preferably falls within a range of from 1.5 mm to 5 mm. Further, the linear member 40 or the linear terminal 26B is a columnar member having a thickness and properties which lead to bending ease, specifically, refers to metal wire rods such as a lead wire made of materials having high solder wettability, such as copper, a copper alloy, iron, and a Cp wire, and a plated lead wire, each having a diameter of 1.5 mm or less. Note that, the diameters of the linear member 40 and the linear terminal 26B preferably fall within a range of from 0.4 mm to 1.2 mm. Further, when the columnar member 26A, the linear member 40, or the linear terminal 26B is formed into a shape other than the circular shape in cross-section, the "diameter" refers to a diameter of a circle having an area equal to that of the cross-sectional shape (area-based diameter).

Next, description is made of the capacitor body 20 used for the capacitor 10 according the embodiment of the present invention. The capacitor body 20 is the same as conventionally known capacitors except that the projecting portion 26 is provided on the end surface 22B opposite to the end surface 22A provided with the two lead wires 24A and 24B.

Similarly to conventional capacitors, the capacitor body 20 normally includes at least a capacitor element, the two lead wires 24A and 24B connected to the capacitor element, and a bottomed cylindrical case for accommodating the capacitor element. Further, the projecting portion 26 is provided to the capacitor body 20 in a projecting manner toward an outside of a bottom surface of the cylindrical case.

Note that, when the columnar member 26A exemplified in FIG. 1 to FIG. 5 serves as the projecting portion 26, the columnar member 26A can be arranged by being welded or bonded to the bottom surface of the cylindrical case. In this context, it is particularly preferred that the cylindrical case and the columnar member 26A be integrally formed. This is because, when the columnar member 26A is mounted through welding or the like to the capacitor body 20 substantially completed except the columnar member 26A, a pressing force is applied in the axial direction of the capacitor body 20. In other words, in this case, a pressure is applied to the capacitor element accommodated in the capacitor body 20, with the result that variation in electrical property of the capacitor 10 and the like are liable to occur. Further, when the cylindrical case and the columnar member 26A are integrally formed, a step of mounting the columnar member 26A can be omitted at the time of manufacturing the capacitor 10.

Figure 7:
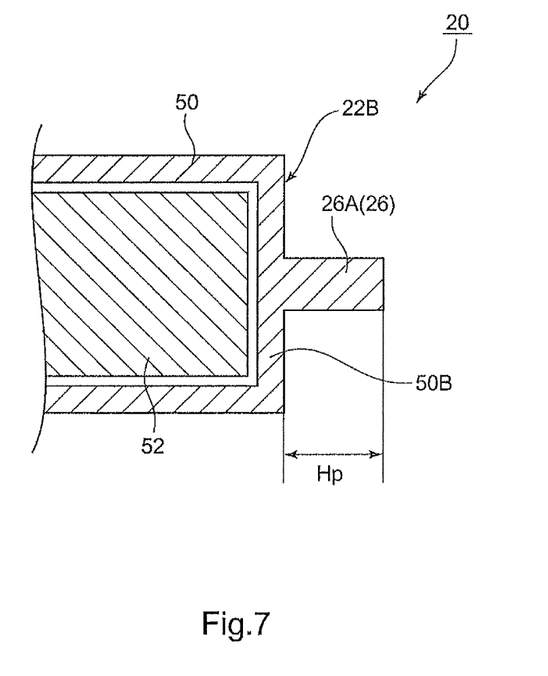
FIG. 7 is a schematic sectional view illustrating an example of a sectional structure of the capacitor body used for the capacitor according to the embodiment of the present invention.

FIG. 7 is a schematic sectional view illustrating an example of a sectional structure of the capacitor body 20 used for the capacitor 10 according to the embodiment of the present invention. Specifically, FIG. 7 illustrates the sectional structure of the capacitor body 20 illustrated in FIG. 1 to FIG. 5. Note that, FIG. 7 illustrates a sectional structure on a side of the capacitor body 20, on which the columnar member 26A is provided, and does not illustrate a sectional structure on a side on which the lead wires 24A and 24B are provided.

In the example illustrated in FIG. 7, the capacitor body 20 includes a bottomed cylindrical case 50 accommodating a capacitor element 52. An outer surface of a bottom portion 50B of the cylindrical case 50 corresponds to the end surface 22B on which the columnar member 26A formed integrally with the cylindrical case 50 is provided. A structure of the capacitor element 52 is appropriately selected in accordance with types of the capacitor. For example, when the capacitor 10 according to the embodiment of the present invention is an electrolytic capacitor, the capacitor element 52 is formed by rolling up a laminated sheet formed through lamination of an anode foil, an electrolytic sheet, and a cathode foil in this order. The anode foil is obtained by forming an aluminum oxide film having a function of a dielectric body on a surface of a roughened aluminum foil. The cathode foil includes an aluminum foil. The electrolytic sheet is a paper base obtained through impregnation with an organic electrolyte solvent, and prevents contact of the anode foil and the cathode foil. Further, the two lead wires 24A and 24B are electrically connected to the capacitor element 52; specifically, one lead wire 24A is connected to the anode foil, and another lead wire 24B is connected to the cathode foil. Further, the cylindrical case 50 is normally made of a metal such as aluminum, and formed integrally with the columnar member 26A, for example, through a pressing process on a metal plate.

A height of the columnar member 26A is not particularly limited. However, specifically, it is preferred that Formula (1) below be satisfied.

$$0 < Hp \leq DC/1.5 \quad \text{Formula (1)}$$

In Formula (1), Hp is a height (mm) of the columnar member 26A, and DC is a diameter (mm) of the capacitor body 20. When the height Hp is set to be equal to or smaller than (the diameter DC of the capacitor body 20)/1.5, in comparison with capacitors with a conventional auxiliary terminal or the capacitor body 20 with the linear terminal 26B, which is exemplified in FIG. 6, a length of the capacitor body 20 with the columnar member 26A, which is exemplified in FIG. 1 to FIG. 5, can be markedly reduced. Thus, at the time of preparing the capacitor body 20 with the columnar member 26A, which is exemplified in FIG. 1 to FIG. 5, or an intermediate product thereof, the capacitor body 20 with the columnar member 26A can be handled much more easily than the capacitors with a conventional auxiliary terminal or the capacitor body 20 with the linear terminal 26B, which is exemplified in FIG. 6. In addition, only with some modifications or substantially without modifications on an existing production line for auxiliary-terminal free capacitors, the capacitors 10A, 10B, 10C, 10D, 10E, and 10F exemplified in FIG. 1 to FIG. 5 can be significantly easily manufactured. Note that, the height Hp more preferably falls within a range of from DC/1 to DC/1.5.

The capacitor case used in preparation of the capacitor 10 according to the embodiment of the present invention particularly preferably includes at least the bottomed cylindrical case, the projecting portion 26 provided at the substantially central portion of the outer surface of the bottom portion of the cylindrical case, and the at least two relief valves 28 arranged in substantially rotational symmetry with respect to the projecting portion 26 on the outer surface.

Figure 8A:
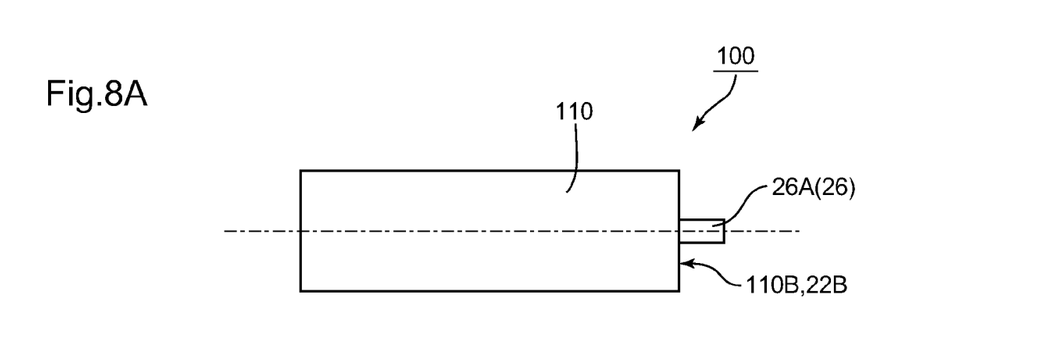
FIG. 8(A) is a side view of the capacitor case.
Figure 8B:
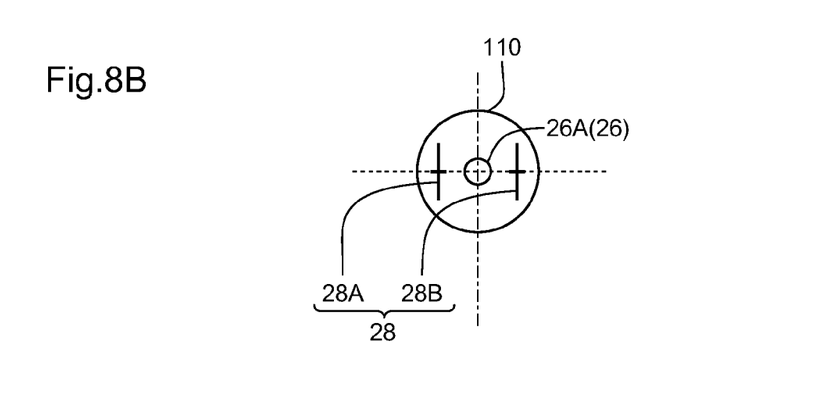
FIG. 8(B) is a front view of the capacitor case.

FIG. 8 are schematic views illustrating an example of the capacitor case according to the embodiment of the present invention. Specifically, FIG. 8 illustrate a capacitor case used in preparation of the capacitors 10A, 10B, 10C, 10D, 10E, and 10F illustrated in FIG. 1 to FIG. 5. FIG. 8(A) is a side view of the capacitor case, and FIG. 8(B) is a front view (bottom view) of the capacitor case. A capacitor case 100 illustrated in FIG. 8 includes a bottomed cylindrical case 110 and the columnar member 26A (projecting portion 26) provided at a substantially central portion of an outer surface 110B of a bottom portion of the cylindrical case 110 (corresponding to the end surface 22B of the capacitor body 20). Note that, an opposite end of the cylindrical case 110 with respect to the end surface 22B is opened. Further, the outer surface 110B is provided with the two relief valves 28A and 28B arranged in substantially rotational symmetry with respect to the columnar member 26A. Note that, as illustrated in FIG. 7, the columnar member 26A is particularly preferably formed integrally with the cylindrical case 110, but may include a separate member to be fixed through bonding to the cylindrical case 110.

Further, in order to achieve space saving or the like in a case of employing a capacitor having a vertically elongated shape, a necessity of mounting the capacitor to the substrate in a manner that an axial centerline of the capacitor is substantially parallel to a front surface of a substrate becomes higher. In view of this, a ratio of a length L with respect to the diameter DC of the capacitor body 20 (L/DC) is preferably 1.2 or more, more preferably 1.5 or more. Meanwhile, an upper limit of the ratio (L/DC) is not particularly limited, but practically, 10 or less. Note that, the "length L" herein refers to a length excluding a height or a length of the projecting portion 26 and the length of the lead wires 24A and 24B.

The capacitor 10 according to the embodiment of the present invention is not particularly limited in type as long as the capacitor body 20 has the columnar shape, and may include any of, for example, (1) electrolytic capacitors such as an aluminum electrolytic capacitor, a tantalum electrolytic capacitor, and a niobium capacitor, (2) an electric double layer capacitor, and (3) a lithium ion capacitor.

Next, description is made of the substrate provided with a circuit using the capacitor 10 according to the embodiment of the present invention. The substrate provided with a circuit according to the embodiment of the present invention includes at least a substrate provided with at least three through-holes passing therethrough in a thickness direction, and the capacitor 10 according to the embodiment of the present invention.

When the capacitor 10D or 10E with the fixing auxiliary terminal 30A exemplified in FIG. 3 or FIG. 4 is used as the capacitor 10, the capacitor 10D or 10E is fixed to the substrate under a state in which the two lead wires 24A and 24B and the fixing auxiliary terminal 30 are inserted respectively in any three through-holes selected from the at least three through-holes. In this case, the capacitor 10D or 10E is fixed to the substrate preferably in substantially close contact therewith.

Figure 9A:
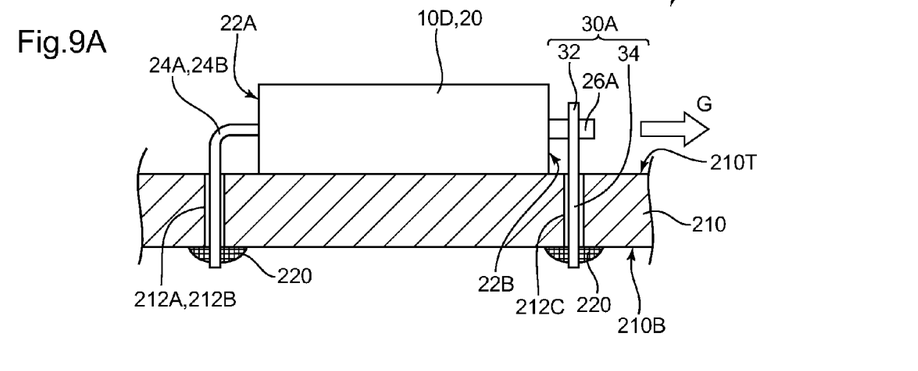
FIG. 9(A) is a sectional view in which a capacitor body is viewed sideways.
Figure 9B:
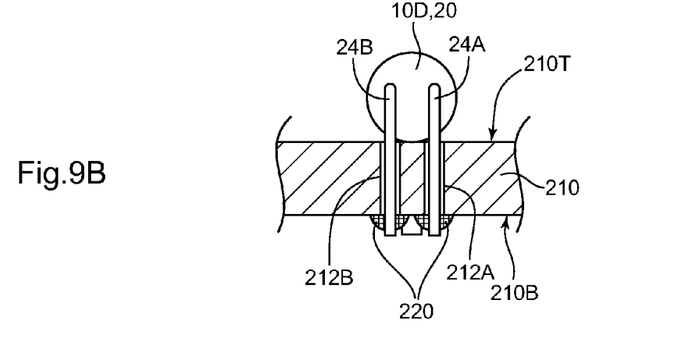
FIG. 9(B) is a sectional view in which the capacitor body is viewed from one end surface side.
Figure 9C:
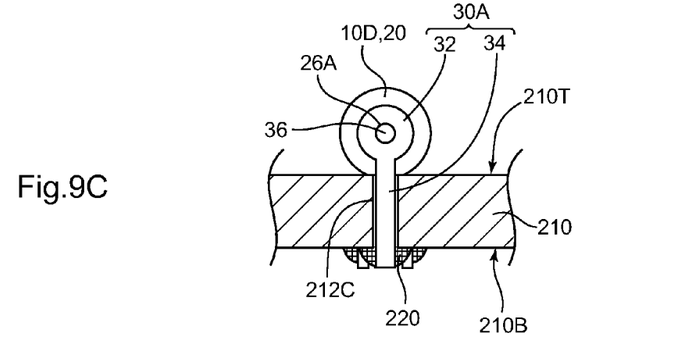
FIG. 9(C) is a sectional view in which the capacitor body is viewed from another end surface side.

FIG. 9 are schematic views illustrating an example of a substrate provided with a circuit according to a first embodiment of the present invention. Specifically, FIG. 9 illustrate a state in which the capacitor 10D with the fixing auxiliary terminal 30A, which is illustrated in FIG. 3, is fixed to a front surface of the substrate. FIG. 9(A) is a sectional view in which the capacitor body 20 is viewed sideways, FIG. 9(B) is a sectional view in which the capacitor body 20 is viewed from one end surface side, and FIG. 9(C) is a sectional view in which the capacitor body 20 is viewed from another end surface side. Note that, FIG. 9(A) does not illustrate a sectional structure of the capacitor 10D, and illustrates an external appearance sideways. A cross-section of a substrate 210 illustrated in FIG. 9(A) does not correspond to a sectional structure obtained by linearly cutting a front surface 210T of the substrate 210, but corresponds to a sectional structure at a position at which the rod-shaped member 34 is provided, and a sectional structure at a position at which the lead wire 24A is provided or a position at which the lead wire 24B is provided.

As illustrated in FIG. 9, a substrate provided with a circuit 200A (200) includes the substrate 210 and the capacitor 10D, the substrate 210 having the front surface 210T to which a side surface of the capacitor body 20 of the capacitor 10D is fixed in close contact. The substrate 210 includes through-holes 212A, 212B, and 212C passing therethrough in a thickness direction of the substrate 210. The lead wire 24A is inserted in the through-hole 212A, the lead wire 24B is inserted in the through-hole 212B, and the rod-shaped member 34 is inserted in the through-hole 212C. Note that, distal end portions of the lead wire 24A, the lead wire 24B, and the rod-shaped member 34 are projected slightly with respect to a back surface 210B of the substrate 210. Through soldering in vicinities of those distal end portions on the back surface 210B, peripheries of the distal end portions are covered with solder 220. Note that, at the time of mounting the capacitor 10D with respect to the substrate 210, the lead wires 24A and 24B are bent in the same direction as the axial direction of the rod-shaped member 34. Note that, when the capacitor 10E with the fixing auxiliary terminal 30B, which is illustrated in FIG. 4, is used instead of the capacitor 10D with the fixing auxiliary terminal 30A, which is illustrated in FIG. 3, at the time of preparing the substrate provided with a circuit 200, the rod-shaped member 34 is bent in the same direction as those of the lead wires 24A and 24B.

Figure 5:
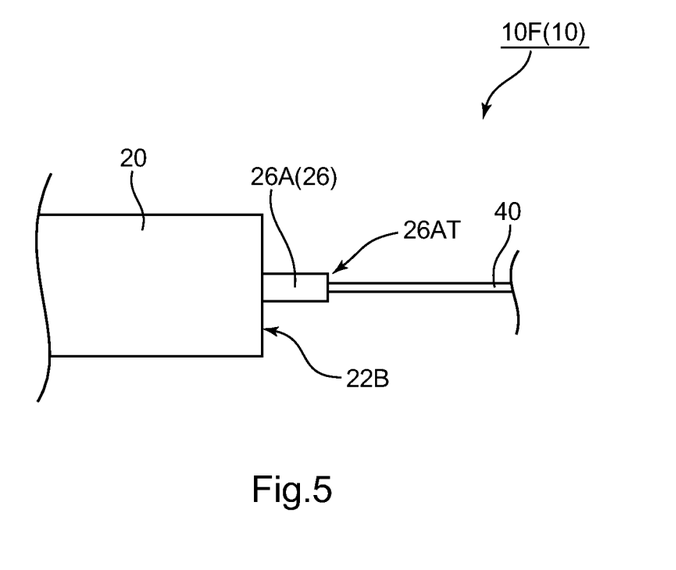
FIG. 5 is a side view illustrating yet another example of the capacitor according to the embodiment of the present invention.
Figure 10:
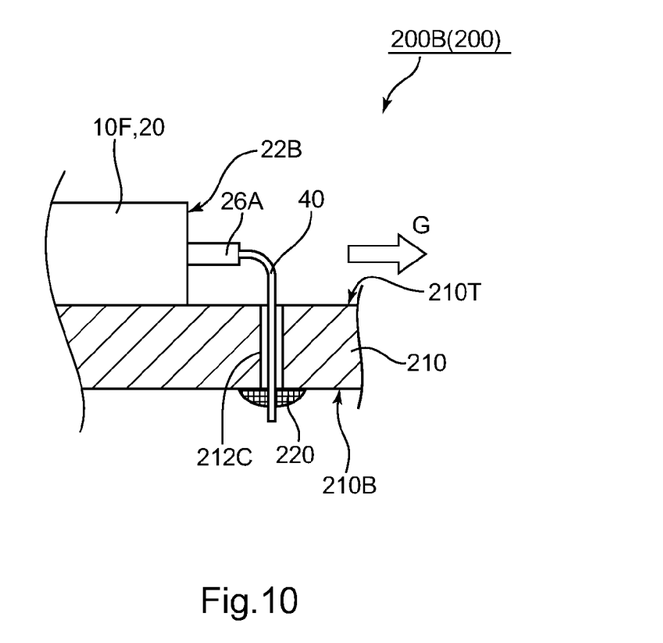
FIG. 10 is a schematic sectional view illustrating an example of a substrate provided with a circuit according to a second embodiment of the present invention.

Meanwhile, when the capacitor 10F exemplified in FIG. 5 is used as the capacitor 10, the capacitor 10F is fixed to the substrate under a state in which the two lead wires 24A and 24B and the linear member 40 are inserted respectively in any three through-holes selected from the at least three through-holes. In this case, the capacitor 10F is fixed to the substrate preferably in substantially close contact therewith. FIG. 10 is a schematic sectional view illustrating an example of a substrate provided with a circuit according to a second embodiment of the present invention, which is the substrate provided with a circuit using the capacitor 10F illustrated in FIG. 5. Note that, FIG. 10 does not illustrate a sectional structure of the capacitor 10F, and illustrates an external appearance sideways.

On a substrate provided with a circuit 200B (200) illustrated in FIG. 10, the linear member 40 is inserted in the through-hole 212C in a bent state in the same direction as those of the lead wires 24A and 24B. A vicinity of a distal end portion of the linear member 40, which is projected slightly with respect to the back surface 210B of the substrate 210, is soldered to the back surface 210B. Besides that, the substrate provided with a circuit 200B illustrated in FIG. 10 has the same structure as that of the substrate provided with a circuit 200A illustrated in FIG. 9.

Figure 6:
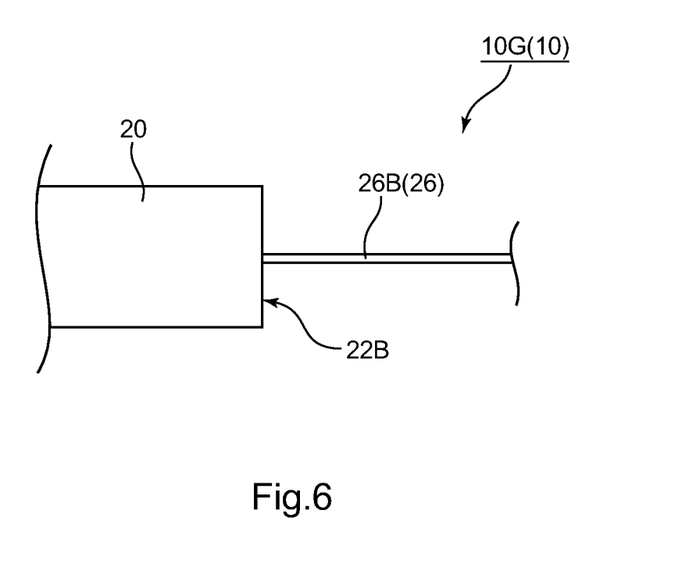
FIG. 6 is a side view illustrating yet another example of the capacitor according to the embodiment of the present invention.
Figure 11:
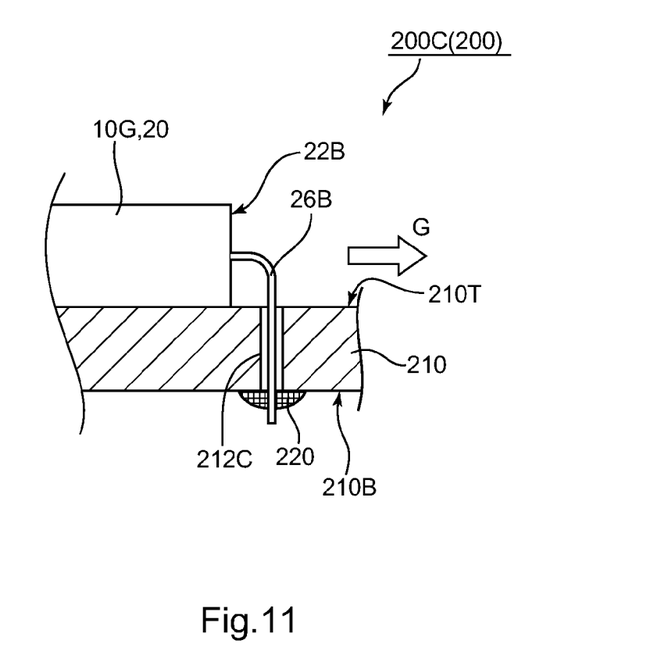
FIG. 11 is a schematic sectional view illustrating an example of a substrate provided with a circuit according to a third embodiment of the present invention.

Further, when the capacitor 10G exemplified in FIG. 6 is used as the capacitor 10, the capacitor 10G is fixed to the substrate under a state in which the two lead wires 24A and 24B and the linear terminal 26B are inserted respectively in any three through-holes selected from the at least three through-holes. In this case, the capacitor 10G is fixed to the substrate preferably in substantially close contact therewith. FIG. 11 is a schematic sectional view illustrating an example of a substrate provided with a circuit according to a third embodiment of the present invention, which is the substrate provided with a circuit using the capacitor 10G illustrated in FIG. 6. Note that, FIG. 11 does not illustrate a sectional structure of the capacitor 10G, and illustrates an external appearance sideways.

On a substrate provided with a circuit 200C (200) illustrated in FIG. 11, the linear terminal 26B is inserted in the through-hole 212C in a bent state in the same direction as those of the lead wires 24A and 24B. A vicinity of a distal end portion of the linear terminal 26B, which is projected slightly with respect to the back surface 210B of the substrate 210, is soldered to the back surface 210B. Besides that, the substrate provided with a circuit 200C illustrated in FIG. 11 has the same structure as that of the substrate provided with a circuit 200A illustrated in FIG. 9.

In the substrate provided with a circuits 200 according to the embodiments of the present invention, which are exemplified in FIG. 9 to FIG. 11, the capacitors 10D, 10F, and 10G are each fixed to the substrate 210 in a manner that the axial direction of the columnar capacitor body 20 is parallel to the surface 210T of the substrate 210. In addition, the side surface of the columnar capacitor body 20 of each of the capacitors 10D, 10F, and 10G is fixed in close contact to the front surface 210T of the substrate 210. Thus, the substrate provided with a circuit 200 can be downsized. In addition, the capacitors 10D, 10F, and 10G are each fixed to the substrate 210 through intermediation of a total of the three terminals provided on both the end surfaces 22A and 22B thereof. Thus, the capacitors 10D, 10F, and 10G are each fixed more stably and firmly to the substrate 210, and are less liable to be influenced by vibration.

Further, the relief valves 28 (not shown in FIG. 9 to FIG. 11) are arranged on the end surface 22B side. Thus, when the gas in the capacitor body 20 is discharged to the outside, the gas is discharged always parallel to the front surface 210T of the substrate 210 and in a specific direction as indicated by an arrow G.

The invention claimed is:

1. A capacitor, comprising at least:
a substantially columnar capacitor body;
two electrode terminals provided on one end surface of the substantially columnar capacitor body;
a projecting portion provided at a substantially central portion of another end surface of the substantially columnar capacitor body; and
at least two relief valves provided on the another end surface, and arranged in places apart from the projecting portion,
wherein, on the another end surface, the at least two relief valves are arranged in substantially rotational symmetry with respect to the projecting portion, and
wherein an axial center line of the projecting portion and an axial center line of the capacitor substantially correspond to each other.

2. A capacitor according to claim 1, wherein the at least two relief valves provided on the another end surface comprise two relief valves.

3. A capacitor according to claim 1,
wherein the projecting portion comprises a columnar member, and
wherein the columnar member comprises a fixing auxiliary terminal mounted thereto.

4. A capacitor according to claim 1,
wherein the projecting portion comprises a columnar member, and
wherein the columnar member comprises a linear member mounted to a top surface of the columnar member.

5. A capacitor according to claim 1, wherein the projecting portion comprises a linear terminal.

6. A capacitor according to claim 3,
wherein the substantially columnar capacitor body comprises at least:
a capacitor element;
the two electrode terminals connected to the capacitor element;
a bottomed cylindrical case for accommodating the capacitor element; and
the columnar member provided at a substantially central portion of an outer surface of a bottom portion of the bottomed cylindrical case, and
wherein the bottomed cylindrical case and the columnar member are formed integrally with each other.

7. A capacitor according to claim 1, wherein a ratio of a length with respect to a diameter of the capacitor is 1.2 or more.

8. A capacitor case, comprising at least:
a bottomed cylindrical case;
a projecting portion provided at a substantially central portion of an outer surface of a bottom portion of the bottomed cylindrical case; and
at least two relief valves arranged in substantially rotational symmetry with respect to the projecting portion on the outer surface and arranged in places apart from the projecting portion.

9. A substrate provided with a circuit, comprising at least:
a capacitor comprising at least:
a substantially columnar capacitor body;
two electrode terminals provided on one end surface of the substantially columnar capacitor body;
a projecting portion provided a substantially central portion of another end surface of the substantially columnar capacitor body, the projecting portion comprising columnar member;
at least two relief valves provided on the another end surface and arranged in places apart from the projecting portion; and
a fixing auxiliary terminal mounted to the projecting portion,
the at least two relief valves being arranged, on the another end surface, in substantially rotational symmetry with respect to the projecting portion,
an axial center line of the projecting portion and an axial center line of the capacitor substantially corresponding to each other; and
a substrate comprising at least three through-holes passing therethrough in a thickness direction of the substrate
wherein the capacitor is fixed to the substrate under a state in which the two electrode terminals and the fixing auxiliary terminal are inserted respectively in any three through-holes selected from the at least three through-holes.

10. A substrate provided with a circuit, comprising at least:
a capacitor comprising at least:
a substantially columnar capacitor body;
two electrode terminals provided on one end surface of the substantially columnar capacitor body;
a projecting portion provided at a substantially central portion of another end surface of the substantially columnar capacitor body, the projecting portion comprising a columnar member;
at least two relief valves provided on the another end surface and arranged in places apart from the projecting portion; and
a linear member mounted to a top surface of the projecting portion,
the at least two relief valves being arranged, on the another end surface, in substantially rotational symmetry with respect to the projecting portion,
an axial center line of the projecting portion and an axial center line of the capacitor substantially corresponding to each other; and
a substrate comprising at least three through-holes passing therethrough in a thickness direction of the substrate,
wherein the capacitor is fixed to the substrate under a state in which the two electrode terminals and the linear member provided to the top surface of the projecting portion are inserted respectively in any three through-holes selected from the at least three through-holes.

11. A substrate provided with a circuit, comprising at least:
a capacitor comprising at least:
a substantially columnar capacitor body;
two electrode terminals provided on one end surface of the substantially columnar capacitor body;
a projecting portion provided at a substantially central portion of another end surface of the substantially columnar capacitor body, the projecting portion comprising a linear terminal; and
at least two relief valves provided on the another end surface and arranged in places apart from the projecting portion, the at least two relief valves being arranged, on the another end surface, in substantially rotational symmetry with respect to the projecting portion,
an axial center line of the projecting portion and an axial center line of the capacitor substantially corresponding to each other, and
a substrate comprising at least three through-holes passing therethrough in a thickness direction of the substrate
wherein the capacitor is fixed to the substrate under a state in which the two electrode terminals and the linear terminal provided to the another end surface are inserted respectively in any three through-holes selected from the at least three through-holes.

* * * * *